United States Patent [19]

Brown

[11] Patent Number: 5,701,112
[45] Date of Patent: Dec. 23, 1997

[54] CRYOGENIC MRI MAGNETS

[75] Inventor: Daniel Edward Brown, Witney, England

[73] Assignee: Oxford Magnet Technology Limited, Oxford, England

[21] Appl. No.: 556,601

[22] Filed: Nov. 13, 1995

[30] Foreign Application Priority Data

Nov. 29, 1994 [GB] United Kingdom ............. 9424069

[51] Int. Cl.⁶ ................................................ H01F 1/00
[52] U.S. Cl. ........................ 335/216; 335/297; 324/318
[58] Field of Search ............................ 335/216, 297, 335/299, 301, 302; 324/318, 319, 324

[56] References Cited

U.S. PATENT DOCUMENTS

| 4,590,452 | 5/1986 | Ries et al. | 335/301 |
| 4,743,880 | 5/1988 | Breneman et al. | 335/216 |
| 5,124,651 | 6/1992 | Danby et al. | 324/318 |
| 5,555,251 | 9/1996 | Kinanen | 324/319 |

FOREIGN PATENT DOCUMENTS

| 251342 A2 | 1/1988 | European Pat. Off. . |
| 460762 A1 | 12/1991 | European Pat. Off. . |
| 2276945 | 10/1994 | United Kingdom . |
| WO92/7278 | 4/1992 | WIPO . |

*Primary Examiner*—Lincoln Donovan
*Attorney, Agent, or Firm*—Keck, Mahin & Cate

[57] ABSTRACT

An electromagnet for use in MRI apparatus comprising an annular vessel inside which annular windings energizable to produce a magnetic field are contained together with iron components, hereinafter termed cold iron, which components are mechanically anchored with respect to the windings, and iron shim rings positioned externally of the vessel within its annular bore, hereinafter termed warm iron, the size and relative position of the shim rings being chosen so that instability of the magnetic field introduced by one shim ring, due to vibration or temperature changes, is substantially compensated for by an equal and opposite effect produced by one or more other shim rings.

9 Claims, 4 Drawing Sheets

CRYOGENIC MRI MAGNETS

This invention relates to electromagnets and more especially it relates to cryogenic electromagnets for use in magnetic resonance imaging (MRI) apparatus.

It is a well understood requirement that magnets for MRI applications should provide a predetermined region of very high homogeneity magnetic field. This region, known as the imaging volume, is the region wherein that portion of a patient to be examined is positioned. It is comparatively easy to achieve high homogeneity with magnets having a relatively long axial length. However, long magnet bores tend to produce adverse patient reactions due to the effects of claustrophobia. Accordingly, it is highly desirable to reduce the axial length of magnets whereby the effects of claustrophobia are also reduced.

In order to achieve shorter magnets, it is known to use iron in the magnet, whereby the field can be concentrated without sacrificing homogeneity to any significant extent. Unfortunately, however, magnetisation of iron tends to be thermally sensitive which results in temperature related field fluctuations. Additionally, magnets which use iron can be vibration sensitive, which also results in magnetic field fluctuations due in this case to changes in the positional relationship between the iron and the magnet windings.

It is known to position iron within the vessel whereby its temperature is stabilised, and whereby the effects of vibration may also be reduced by mechanically anchoring the iron with respect to the magnet windings so that differential movement therebetween is minimised. However, because of the mass of iron required and because of other dimensional design considerations it may not be possible with short magnets to contain all of the iron required for optimum performance within the vessel without introducing other problems.

It is an object of the present invention to provide a relatively short magnet with high tolerance of vibration and low sensitivity to temperature variations, or at least a magnet which is a good compromise between these desirable features, whereby a magnetic field is provided with an acceptably high degree of homogeneity as required for MRI applications.

According to the present invention, an electromagnet for use in MRI apparatus comprises an annular vessel inside which annular windings energisable to produce a magnetic field are contained together with iron components, hereinafter termed cold iron, which components are mechanically anchored with respect to the windings, and iron shim rings positioned externally of the vessel within its annular bore, hereinafter termed warm iron, the size and relative position of the shim rings being chosen so that magnetic field instability introduced by one shim ring, due to vibration or temperature changes, is substantially compensated for by an equal and opposite effect produced by one or more other shim rings.

By containing most of the iron required within the vessel, problems related to vibration and temperature sensitivity are to some extent overcome and by arranging that the other iron required is in effect self compensating, field instability due to temperature and/or vibration can be substantially eliminated or at least significantly reduced.

If the central magnetic field of a magnet according to the present invention is defined in terms of a spherical harmonic basis set, then in a cylindrical magnet exhibiting azimuthal symmetry, the field is given by $$B(r,\theta) = B_0 + \sum_{n=1}^{\infty} A_n \left( \frac{r}{R_0} \right)^n P_n(\cos\theta) \quad (1)$$

where
- $A_n = n^{th}$ order harmonic amplitude
- $R_0$ = Normalising Radius
- $P_n$ = Legendre Polynomial of order n If the total field (cold iron+warm iron components) is defined in terms of the amplitudes $B_0^T$ and $A_n^T$, the cold magnet field in terms of $B_0^C$ and $A_n^C$ and the field due to the $i^{th}$ warm iron ring pair in terms of $B_0^i$ and $A_n^i$. Then the total field is related to the cold and warm fields by $$B_0^T = B_0^C + \sum_i B_0^i \quad (2a)$$

$$A_n^T = A_n^C + \sum_i A_n^i \quad (2b)$$

Normally in magnet design $B_0^T$ and $A_n^T$ are optimised to acheive a predetermined field magnitude and homogeneity but in the present case additional constraints are introduced on $$\sum_i A_n^i$$

and/or on $$\sum_i B_0^i \, \bullet$$

Now, $B_0^i$ and $A_n^i$ are directly proportional to the saturation magnetisation of the rings, assuming the rings are axially magnetised to saturation. However, the saturation magnetisation of iron has a predetermined temperature sensitivity. Therefore, $B_0^i$ and $A_n^i$ also have a temperature sensitivity of the same size which translates into a temperature sensitivity in the magnet DC field ($B_0^T$) and homogeneity ($A_n^T$) respectively.

Now, while it is impossible to modify the sensitivity of $B_0^i$ or of $A_n^i$, it may be possible to find a shim set geometry such that $$\sum_i B_0^i = 0 \quad (3a)$$

$$\sum_i A_n^i = 0 \text{ (for a given } n\text{)} \quad (3b)$$

Such a set is described as a zero order compensated and an $n^{th}$ order compensated shim set respectively.

In this case, the thermal sensitivity of the compensated order is zero, provided any temperature change is the same for all i components. It is crucial to understand that there is also a differential sensitivity in the compensated order which becomes important when the shim temperatures diverge. The advantage is that it is easier to stabilise the relative temperature of the shims than it is to stabilise their absolute temperatures.

Thus, in accordance with one embodiment of the invention, the warm iron comprises a shim ring set which is zero order compensated.

In accordance with another aspect of the invention, the shim ring set is $n^{th}$ order compensated.

In accordance with a further aspect of the invention, the shim ring set is both zero order compensated (ie the DC field is compensated) and $n^{th}$ order compensated where n=2.

In order to achieve compensation, as aforesaid, one or more pairs of shim rings may be provided in accordance with the particular application in view.

Some embodiments of the invention will now be described by way of example only, with reference to the accompanying drawings, in which.

Figure 1:
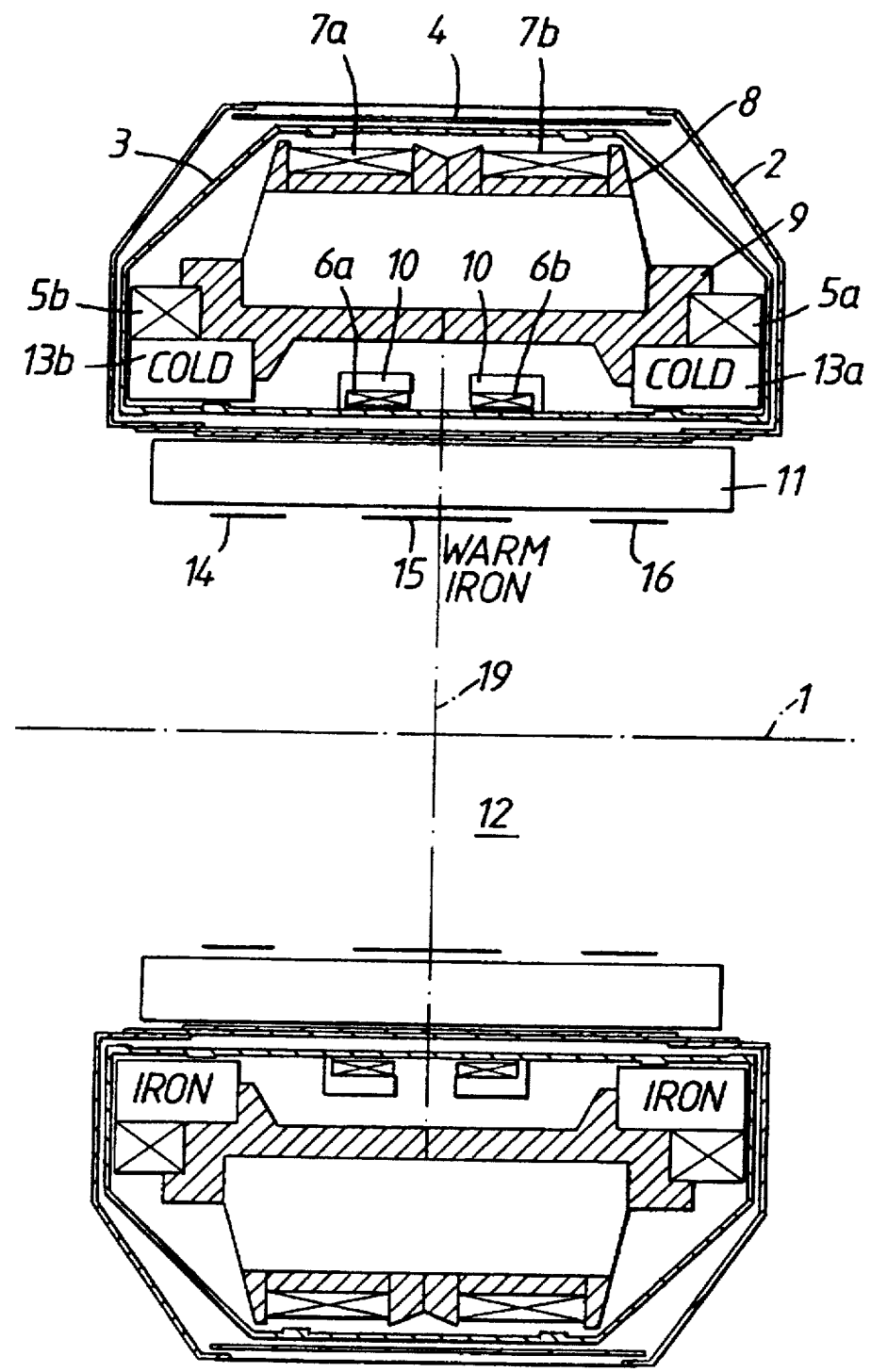
FIG. 1 is a sectional side view of a cryogenic magnet assembly which forms a part of an MRI system.

Referring now to FIG. 1, as can be seen from the drawing, the magnet is annular in construction and substantially symmetrical about its longitudinal axis 1. The magnet comprises an outer housing 2 within which is contained a vessel 3 which in use is filled with liquid helium. In order to improve thermal insulation a heat shield 4 is positioned between the vessel 3 and the housing 2. The magnet comprises magnetising windings 5a, 5b and 6a, 6b and shield windings 7a, 7b which serve to contain the field produced by the magnetising windings 5a, 5b and 6a, 6b. The windings 7 are supported on a former 8 and the windings 5 and 6 are supported on formers 9 and 10 respectively.

In order to facilitate MRI operation, gradient coils 11 are provided within the bore 12 of the annulat vessel. Along side the windings 5a and 5b, cold iron shim rings 13a and 13b respectively are provided. By containing the shim rings 13a and 13b within the vessel 3, they are effectively temperature stabilised, and by arranging that they are positionally fixed with respect to the windings 5a and 5b, they are rendered substantially insensitive to vibration which might otherwise produce differential movement between the shim rings 13a and 13b and their associated windings 5a and 5b.

Although it is highly desirable to provide an arrangement as thus far described, wherein the iron is enclosed within the vessel 3. For some applications it is not possible with the dimensional constaaints imposed to contain all of the iron in the vessel.

Accordingly, additional iron shim rings 14, 15 and 16 are provided in the form of warm iron which is positioned in the bore 12 adjacent to the gradient coils 11. As hereinbefore explained, the shim rings 14, 15 and 16 in the bore 12 are arranged to be substantially self compensating, i.e. instability produced by temperature changes and/or vibration in one shim is arranged to be compensated for by equal and opposite instability due to the other shim or shims. The theory behind this compensation has been earlier explained.

In the arrangement shown in FIG. 1, a single pair of shim rings 14, 16 are provided symmetrically disposed with respect to the shim ring 15 which is centrally positioned.

Figure 2:
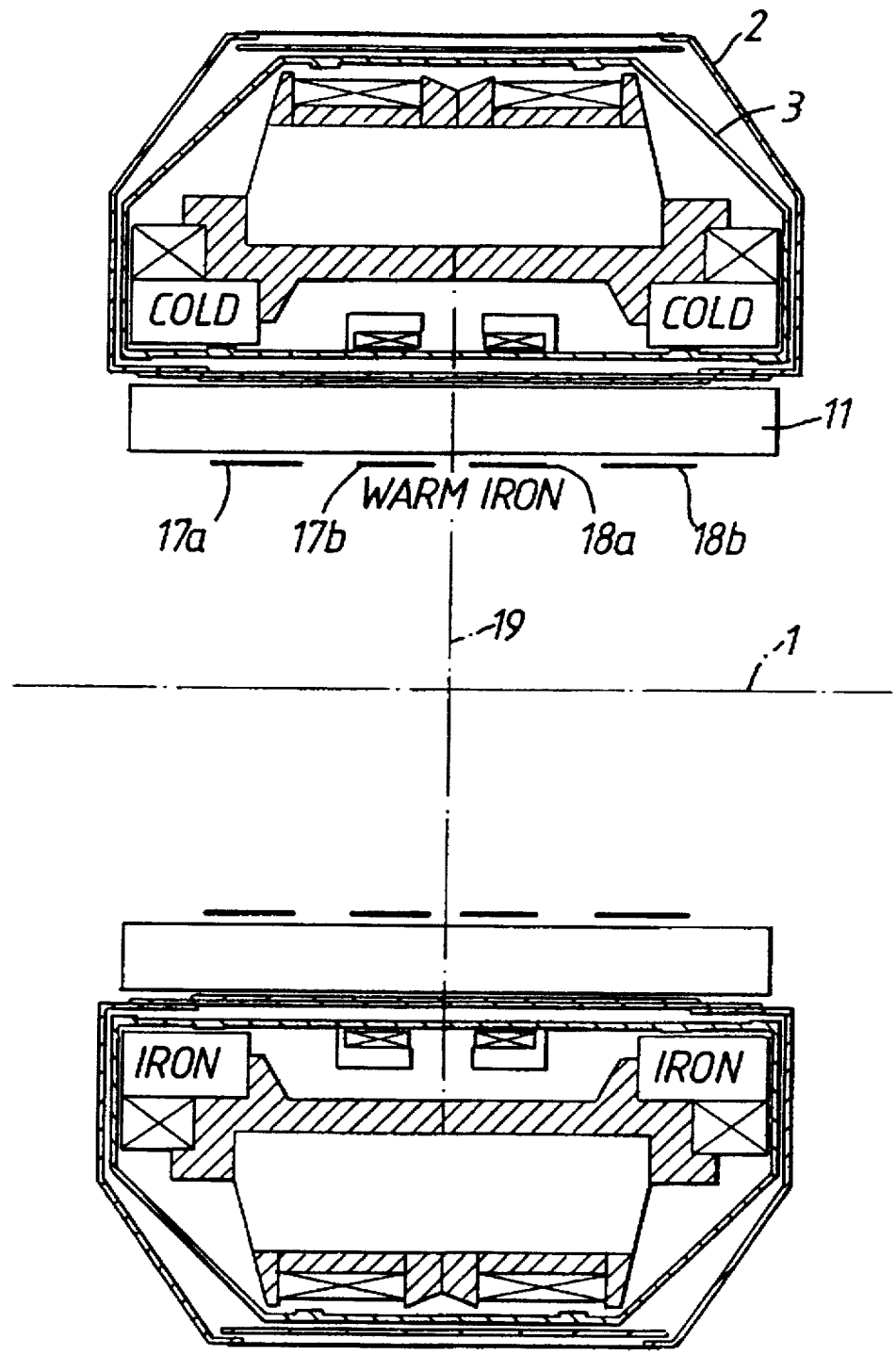
FIG. 2 is a sectional side view of an alternative cryogenic magnet for MRI applications.

In an alternative arrangement however, as shown in FIG. 2, wherein parts of the drawing which correspond to FIG. 1 bear the same numerical designation, two pairs of shim rings 17a, 17b and 18a, 18b are provided arranged symmetrically about a central axis 19 orthogonal to the longitudinal axis 1. The choice of warm shim ring components is determined by the application in view and accordingly by the characteristics required.

The. arrangement of FIG. 1 serves to provide stabilised homogeneity whereas in FIG. 2 the arrangement of shim rings has been chosen to provide optimum dc field stabilisation.

The criteria for thermal sensitivity stabilisation has already been herein explained with reference to the theory involved. The criteria however for vibration sensitivity minimisation tends to be an empirically determined function which will now be considered.

For a system of warm iron shim rings and coils, which are symmetrically disposed around the centre of a magnet, the odd orders (see equation 1) are zero. Now if the warm iron shim rings are displaced axially relative to the cold magnet, so that they are still concentric therewith but not symmetrically disposed about the central plane orthogonal with the longitudinal axis, then they will introduce some odd order amplitudes into the function as setforth in equation 1. If the displacement is small enough, the even orders will be unchanged.

Figure 3:
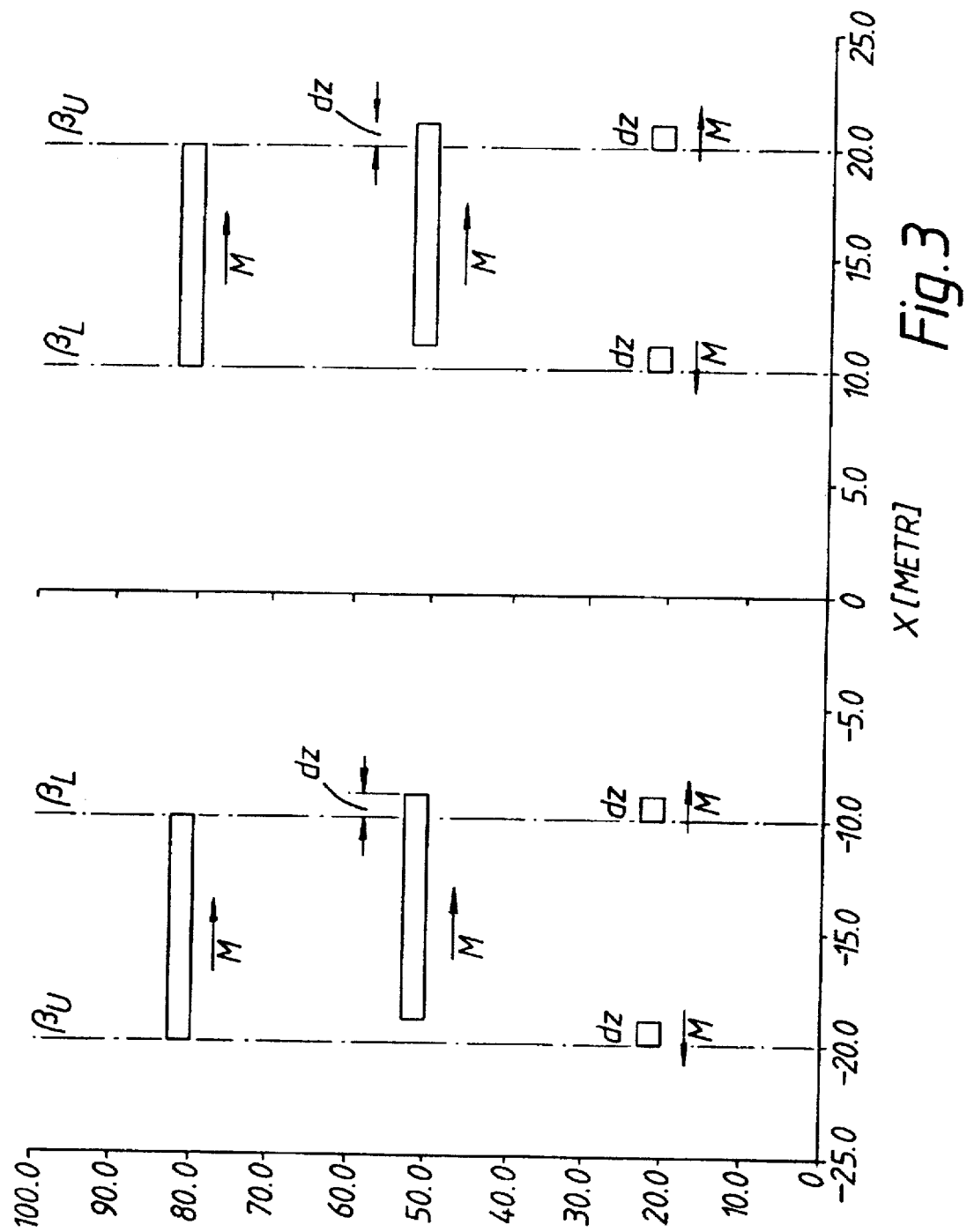
FIG. 3 is a diagram illustrating the effect of shim ring displacement from a central axis 19 as shown in FIG. 2, and, FIG. 4 is a graph of amplitudes Z1 and Z3 introduced by a pair of filamentary iron rings.

This can be shown by the following argument. First of all, define a filamentary pair of iron rings, having small cross sectional area, in terms of a parameter $\beta$, the ratio of the axial separation to the common diameter. Then consider the effect of displacing a pair of thin, iron rings through a small distance (dz). As illustrated in FIG. 3, if the axial extent of the rings is defined by $\beta_L$ and $\beta_u$, then this is equivalent to creating two pairs of rings of thickness dz at $\beta_L$ and $\beta_u$. The elements of these rings are magnetised in opposite directions and therefore introduce only odd orders to the central field.

This effect results in a sensitivity of the homogeneity to axial vibrations of the shim set relative to the cold magnet (non-axial vibrations are not considered). The sensitivity can be quantified in terms of the odd order amplitudes introduced per mm displacement of the shim set. This can also be translated into a pk—pk homogeneity shift on the imaging volume.

Figure 4:
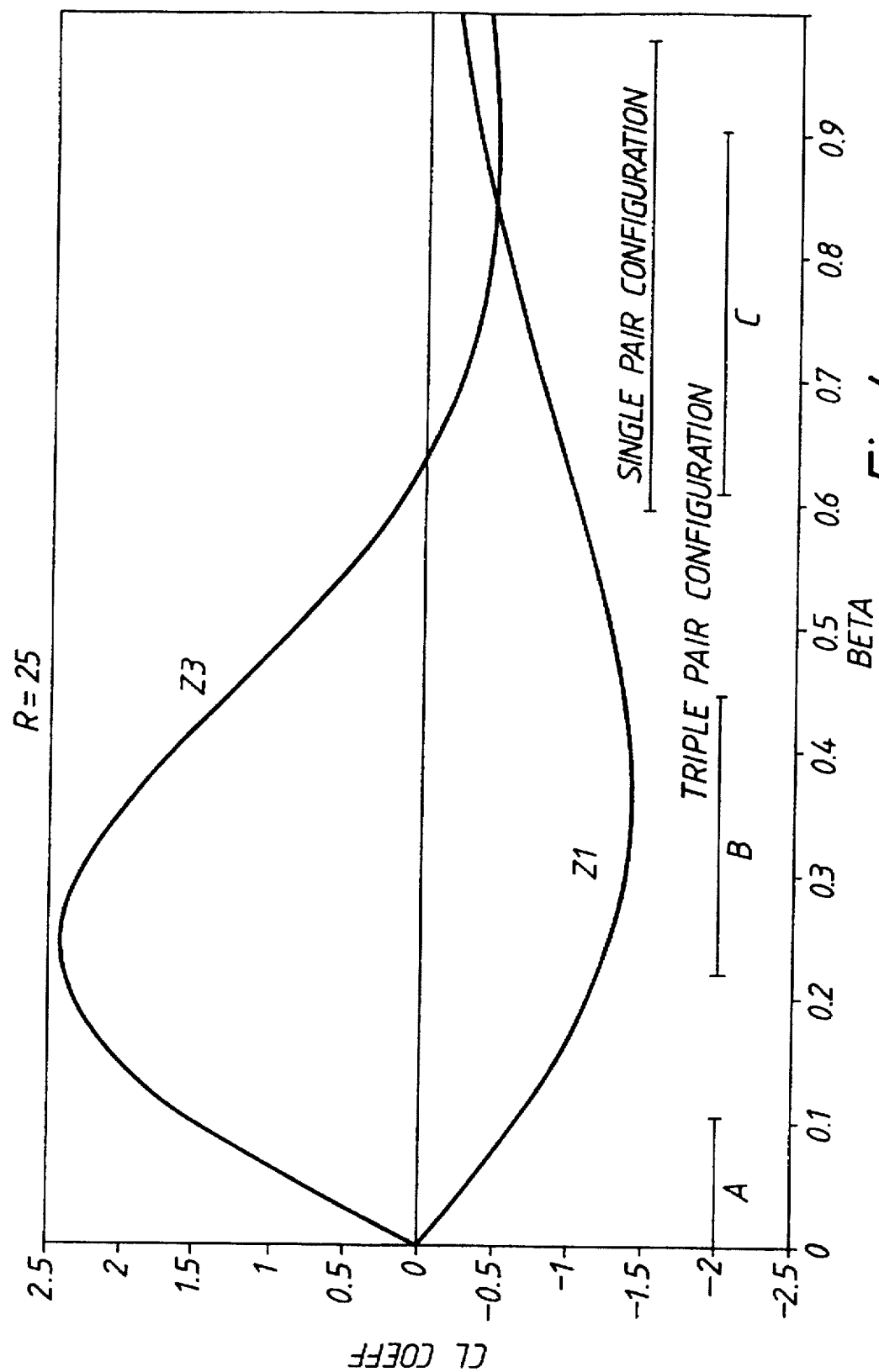

But how can the vibrational sensitivity of a given shim configuration be estimated and optimised? In FIG. 4, the first and third order harmonic amplitudes introduced by a pair of filamentary iron rings with opposite magnetisation are plotted as a function of $\beta$. These amplitudes are plotted for the case where the magnetisation vectors are pointing away from the mid plane of the magnet. For the opposite mode, the signs of the amplitudes are reversed. Notice from FIG. 3 that the filamentary pairs created by the displacement have opposite modes of magnetisation. Therefore, a shim configuration such as shown in FIG. 2 will introduce very little first order amplitude when displaced. FIG. 4 also demonstrates that the vibrational sensitivity of a shim set is improved greatly of the shim set comprises more than one pair as shown in FIG. 2, since there is much more scope for compensating the low order terms.

It will be appreciated that a magnet according to the present invention may be made shorter by accepting a high degree of inhomogeneity of the field due to 'cold' components of the magnet, and then correcting this inhomogeneity using iron shims in the warm bore which serve as a 'self compensated' shim ring set such that the sensitivity with respect to temperature and/or vibrations normally associated with warm iron shim rings is compensated for. As will be readily apparent to the cognoscenti it is not possible to compensate against all factors simultaneously and accordingly a choice between homogeneity and the dc field will need to be made whereby satisfactory sensitivity to vibration can be determined according to the application envisaged.

I claim:

1. An electromagnet of the solenoid type for use in MRI apparatus, comprising:

an annular vessel having a coaxial cylindrical warm bore, annular windings for producing magnetic filed, and cold iron being mechanically anchored with said windings inside of said vessel; and iron shim rings positioned inside of the coaxial cylindrical warm bore, wherein the size and relative position of the shim rings being chosen so that instability of the magnetic filed introduced by one shim ring, due to vibration or temperature changes, is substantially compensated for by an equal and opposite effect produced by one or more other shim rings.

2. An electromagnet as claimed in claim 1, wherein the warm iron comprises a shim ring set which is zero order compensated.

3. An electromagnet as claimed in claim 1, wherein the warm iron comprises a shim ring set which is $n^{th}$ order compensated.

4. An electromagnet as claimed in claim 3, wherein the shim ring set is both zero order compensated and $n^{th}$ order compensated where n=2.

5. An electromagnet as claimed in claim 1, wherein the warm iron comprises a shim ring set which includes one pair of shim rings.

6. An electromagnet as claimed in claim 5, wherein the said pair of shim rings are arranged one on either side of a centrally disposed shim ring.

7. An electromagnet as claimed in claim 1, wherein the warm iron comprises a shim ring set which includes two pairs of shim rings.

8. An electromagnet as claimed in claim 5, wherein the shim rings are symmetrically disposed about a central axis orthogonal with the longitudinal axis of the magnet.

9. An electromagnet as claimed in claim 5, wherein at least one pair of shim rings are offset with respect to a central axis orthogonal with the longitudinal axis of the magnet.

* * * * *